US006567966B2

(12) United States Patent
Miller

(10) Patent No.: US 6,567,966 B2
(45) Date of Patent: May 20, 2003

(54) INTERWEAVED INTEGRATED CIRCUIT INTERCONNECTS

(75) Inventor: Brian C. Miller, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 80 days.

(21) Appl. No.: 09/783,434

(22) Filed: Feb. 14, 2001

(65) Prior Publication Data

US 2002/0112220 A1 Aug. 15, 2002

(51) Int. Cl.$^7$ ................................................ G06F 17/50
(52) U.S. Cl. ............................................ 716/10; 716/8
(58) Field of Search ........................................ 716/1–14

(56) References Cited

U.S. PATENT DOCUMENTS

| | | | | |
|---|---|---|---|---|
| 4,893,170 A | * | 1/1990 | Tokuda et al. ............... | 257/204 |
| 5,065,355 A | * | 11/1991 | Hayase ......................... | 716/14 |
| 5,123,107 A | * | 6/1992 | Mensch, Jr. .................. | 716/10 |
| 5,306,967 A | * | 4/1994 | Dow ............................ | 326/101 |
| 5,572,684 A | * | 11/1996 | Canik et al. ................. | 710/106 |
| 5,687,088 A | * | 11/1997 | Tomita ......................... | 703/15 |
| 5,790,414 A | * | 8/1998 | Okano et al. ................. | 716/13 |
| 6,161,081 A | * | 12/2000 | Hashmi et al. ................ | 703/14 |
| 6,175,947 B1 | * | 1/2001 | Ponnapalli et al. ............ | 716/5 |
| 6,184,702 B1 | * | 2/2001 | Takahashi et al. ........... | 257/659 |
| 6,185,726 B1 | | 2/2001 | Chou ............................ | 716/18 |
| 6,253,359 B1 | * | 6/2001 | Cano et al. .................... | 716/5 |
| 6,363,516 B1 | * | 3/2002 | Cano et al. .................... | 716/10 |

OTHER PUBLICATIONS

Nose et al., "Two Schemes to Reduce Interconnect Delay in Bi–directional and Uni–directional Buses", Symposium on VLSI Digest of Technical Papers, Jun. 2001, pp. 193–194.*

Yim et al., "Reducing Cross–coupling Among interconnect Wires in Deep–submicron Datapath Design" Design Automation Conference, 1999 Proceedings 36th, Jun. 1999, pp. 485–490.*

Liyong Wang, "Modeling of High Speed Metal–Insulator–Semiconductor Interconnections: The Effect of ILD on Slow–Wave Attenuation".

Sylvester, et al., "Investigation of Interconnect Capacitance Characterization using Charge–Based Capacitance Measurement (CBCM) Technique and 3–D Simulation," IEEE Journal of Solid–State Circuits, Mar. 1998, pp. 500–503.

Dennis Sylvester, "High Frequency VLSI Interconnect Modeling," May 1997.

Peter M. Campbell, "Optimization Of Circuits And Physical Design In A High–Speed Bipolar Risc Processor," Rensselaer Polytechnic Institute, Troy, New York, 1997.

Peter M. Campbell, "Capacitance Modeling for Non–planar Interconnection Process," Chapter Six, http://inp.cie.rpi.edu/~campbell/thesis/chapter6.html.

Ravishankar Arunachalam and Larry Pileggi, "Timing Closure in DSM Design," Sep. 2000, Integrated System Design, http://www.isdmag.com/editorial/2000/methodology0009.html.

* cited by examiner

*Primary Examiner*—Vuthe Siek
*Assistant Examiner*—Lin Sun James

(57) ABSTRACT

Systems and methods are presented for decreasing the effect of Miller capacitance on adjacent interconnects in an integrated circuit. The systems and methods include interweaving interconnects with signals traveling in one direction with interconnects with signals traveling in the opposite direction. The systems include a system for fabricating integrated circuits with interweaved interconnects and an integrated circuit with interweaved interconnects.

24 Claims, 4 Drawing Sheets

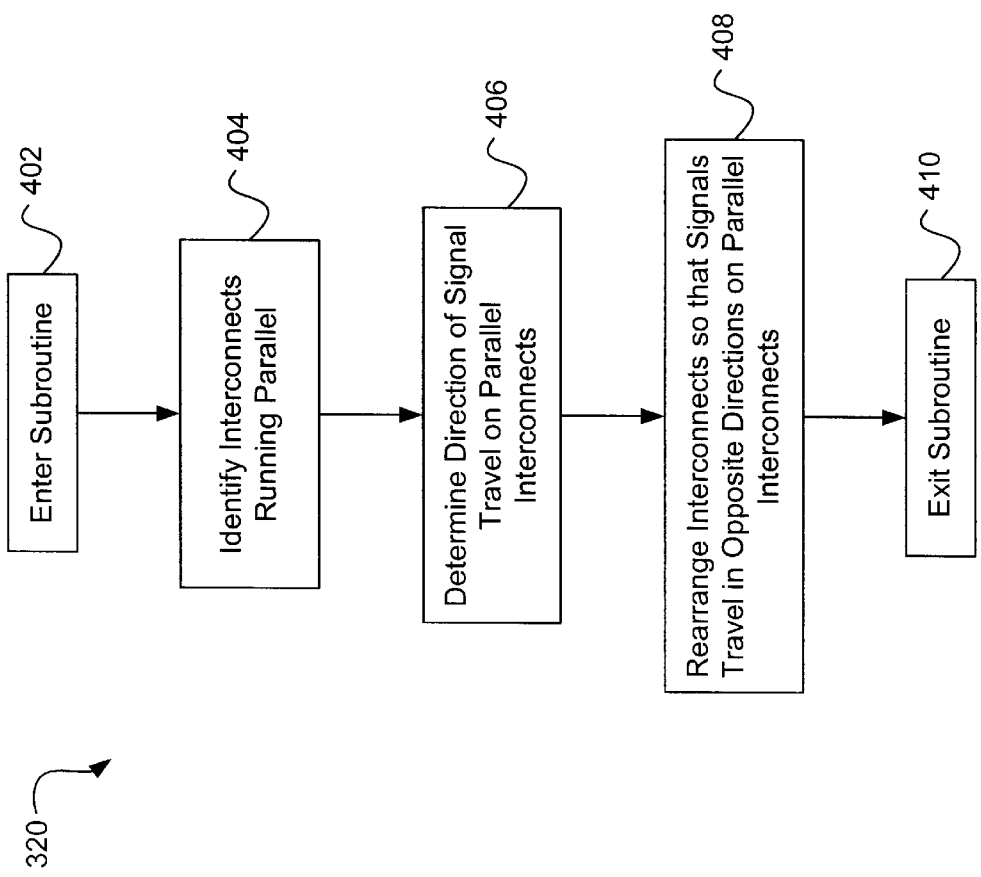

INTERWEAVED INTEGRATED CIRCUIT INTERCONNECTS

TECHNICAL FIELD

The present invention is generally related to the design and fabrication of integrated circuits (ICs) and, more particularly, is related to a system and method for interweaving interconnects on an integrated circuit to reduce interconnect-to-interconnect capacitance.

BACKGROUND OF THE INVENTION

The constant goals in the field of integrated circuit design and fabrication are to design and build faster, smaller, more powerful, and less expensive integrated circuits. As designers have built integrated circuits to meet these goals the designers have confronted, and for the most part overcome, a variety of obstacles. In general, overcoming one obstacle tends to give rise to a new obstacle. An obstacle that could safely be ignored in the past becomes critical limiting factors as a prior obstacle is overcome. Due to advances in the field, interconnect-to-interconnect capacitance, and associated interconnect delay, has ripened into a critical limitation in the design and fabrication of integrated circuits.

An integrated circuit is a group of functional blocks interconnected by conductors. The conductors are known as interconnects. In the past, while striving to build faster integrated circuits, interconnect delay could, for the most part, be ignored while attention was focused on overcoming other obstacles such as designing faster, smaller, and more powerful functional blocks. The functional blocks may be logic gates, transistors, state machines, algorithmic units, pads driving data off the chip and onto external devices, or any other functional integrated circuit unit. Functional blocks may also be defined as any device on an integrated circuit that is attached to an interconnect.

Interconnect delay is a function of the resistance and the capacitance associated with the interconnects. The resistance of the interconnects is proportional to the length and inversely proportional to the cross-sectional area of the interconnects. To meet the goal of designing and building more powerful integrated circuits, the number of functional blocks on integrated circuits has increased. The greater number of functional blocks must be interconnected in a smaller area to meet the goal of building smaller integrated circuits. This has lead to more complexity on the integrated circuit and greater interconnect routing congestion. To overcome these obstacles, interconnects have become thinner. As will become apparent below, thinner interconnects have drawbacks such as increased resistance. Designers have attempted to minimize the adverse effects of thinner interconnects by increasing the height of interconnects. In the midst of these changes interconnects have become longer in proportion to their height and width.

The increased resistance associated with thinner interconnects has also led to a need for repeaters. Repeaters are periodically spaced on the interconnect to boost the power of the signal carried by the interconnect. The increased power prevents the interconnect resistance from eroding the signal beyond the point of recovery prior to the time the signal arrives at the target functional block. The repeaters are often a buffer comprised of two inverters. The power boost the repeaters provide to the signal ultimately leads to faster signal speed. The interconnect can be envisioned as broken up into segments with each segment containing one repeater.

Unfortunately, the change in geometry of the interconnects has increased electrical interaction between adjacent interconnects. In particular, the interconnect capacitance has become a far more important component of interconnect delay. Interconnect capacitance arises mainly from two components. Interconnect capacitance has an interconnect-to-substrate component and an interconnect-to-interconnect component. The interconnect-to-interconnect component is primarily a result of plate capacitance and Miller capacitance. The plate capacitance is the result of the plate area and the distance between the sides of adjacent interconnects. The Miller capacitance is related to the simultaneous movement of signals on closely spaced interconnects. Interconnect-to-interconnect capacitance may also be referred to as coupling capacitance.

The interconnect-to-substrate component of interconnect capacitance is well understood. After integrated circuits were reduced in size enough that interconnect capacitance became a limitation, it was the interconnect-to-substrate component that was the dominant factor with relatively short and thick interconnects. The interconnect-to-substrate component is relatively easy to model since it does not depend upon independent variables such as the type of traffic carried on neighboring interconnects. Since interconnects have become thinner and relatively taller, the interconnect-to-substrate capacitance component of interconnect capacitance has diminished and the interconnect-to-interconnect component has become the critical design limitation.

As mentioned above, the interconnect-to-interconnect plate capacitance component is generally related to the geometry of the interconnects and the distance to neighboring interconnects. This makes the plate capacitance component, like the interconnect-to-substrate capacitance, a relatively easy to model component. One of the challenging aspects of the Miller capacitance component of interconnect delay in the design of integrated circuits is that it is dependent upon the direction and the type of signal traveling on neighboring interconnects, the system architecture, and the system timing. Therefore, the Miller capacitance cannot be easily predicted or modeled.

The timing of the entry of a signal on an interconnect is generally a function of the integrated circuit clock and the integrated circuit architecture. The signal entry timing may also be affected by the processing being performed at any functional block. These signal entry timing factors are well understood in the field. Integrated circuit designers, using well known software, base computer models of integrated circuits in part on these well known signal entry timing factors.

Uncertainty and unpredictability in any integrated circuit component leads to over design. The unpredictability of the Miller capacitance has lead to over design. Designers typically assume the worst case scenario in regard to Miller capacitance and increase the distance between interconnects to reduce the worst case effects of Miller capacitance.

In the typical integrated circuit, the direction of signal travel on interconnects is primarily a function of the integrated circuit architecture. The designer typically simply determines two nodes on functional blocks that require connection and runs a line between the two nodes. Although there is no predetermined method for placing interconnects traveling in the same direction next to each other, the typical integrated circuit architecture generally leads to a series of neighboring interconnects having signals traveling in the same direction. Since the Miller capacitance is related to the simultaneous movement of signals on closely spaced interconnects, Miller capacitance plays a large part in interconnect delay of neighboring interconnects having signals traveling in the same direction.

The typical integrated circuit is no longer a single layer device. The proportional affect of interconnect-to-interconnect capacitance compared to interconnect-to-substrate capacitance is even more important when the layering of interconnect layers is considered. To meet the designers' goals, integrated circuits are increasingly becoming layered devices. As upper layers move further away from ground the interconnect-to-interconnect capacitance becomes more much important than interconnect-to-ground capacitance. Because of the interconnect-to-interconnect capacitance, integrated circuit designers typically allow large margins-of-error in designing interconnect layouts. The Miller capacitance is an even greater cause of large margins-of-error in upper layers than in lower layers. Thus interconnect-to-interconnect capacitance, and the Miller capacitance component of interconnect-to-interconnect capacitance, undesirably lead to larger interconnects, larger buses, and ultimately larger and slower integrated circuits.

One approach to minimizing the adverse effects of interconnect-to-interconnect capacitance and to increase speed via lower resistance is to increase the cross-section area of the interconnects. A second is to increase the space between interconnects. A third is to place an electromagnetic shield, for example an additional grounded interconnect, between the interconnects. However, all of these approaches reduce the space available on the integrated circuit and therefore adversely affect the constant goals in integrated circuit design and fabrication of faster, smaller, more powerful, and less expensive integrated circuits.

Thus, a heretofore unaddressed need exists in the industry to address the aforementioned deficiencies and inadequacies.

SUMMARY OF THE INVENTION

The present invention provides a system and method for decreasing the effect of Miller capacitance on adjacent interconnects in an integrated circuit. This is accomplished by interweaving interconnects with signals traveling in one direction with interconnects with signals traveling in the opposite direction. The system is presented in the form of a system for fabricating integrated circuits with interweaved interconnects and an integrated circuit system with interweaved interconnects.

Briefly described in architecture, the system for fabricating interweaved integrated circuit interconnects can be implemented as follows. Where the integrated circuit has a plurality of functional blocks, the integrated circuit is designed to accomplish a task, the system includes a mechanism for identifying a plurality of interconnects that connect a portion of the functional blocks, a mechanism for determining the direction of signal travel on each of the plurality of interconnects; and a mechanism for selecting the placement of each of the plurality of interconnects so that the direction of signal travel alternates on adjacent interconnects to the extent interconnect-to-interconnect capacitance is reduced without significantly adversely affecting the task.

Briefly described in architecture, the integrated circuit system with interweaved interconnects can be implemented as follows. Where the integrated circuit has functional blocks, the system includes a first plurality of parallel interconnects that carry signals in a first direction, a second plurality of parallel interconnects, which are also parallel to the first plurality of parallel interconnects, that carry signals in the opposite direction. The interconnects of the first plurality of parallel interconnects lay adjacent and between two of the interconnects of the second plurality of parallel interconnects. The first plurality and second plurality of parallel interconnects having been selected from the total number of interconnects on the integrated circuit, the selection based on whether the placement of the interconnects of the first plurality of parallel interconnects between two of the interconnects of the second plurality of parallel interconnects results in a reduction in the Miller capacitance component of interconnect-to-interconnect capacitance.

The present invention can also be viewed as providing a method for fabricating interweaved integrated circuit interconnects. In this regard, the method can be broadly summarized by the following steps: identifying a plurality of interconnects that connect a portion of the functional blocks; determining the direction of signal travel on each of the plurality of interconnects; and placing each of the interconnects so that the direction of signal travel alternates on adjacent interconnects to the extent interconnect-to-interconnect capacitance is reduced without significantly adversely affecting the task. The method for fabricating interweaved integrated circuit interconnects may be practiced as a subroutine of integrated circuit design software.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 4 is a flow chart of the interweaved integrated circuit interconnect subroutine of FIG. 3.

DETAILED DESCRIPTION

Figure 1:
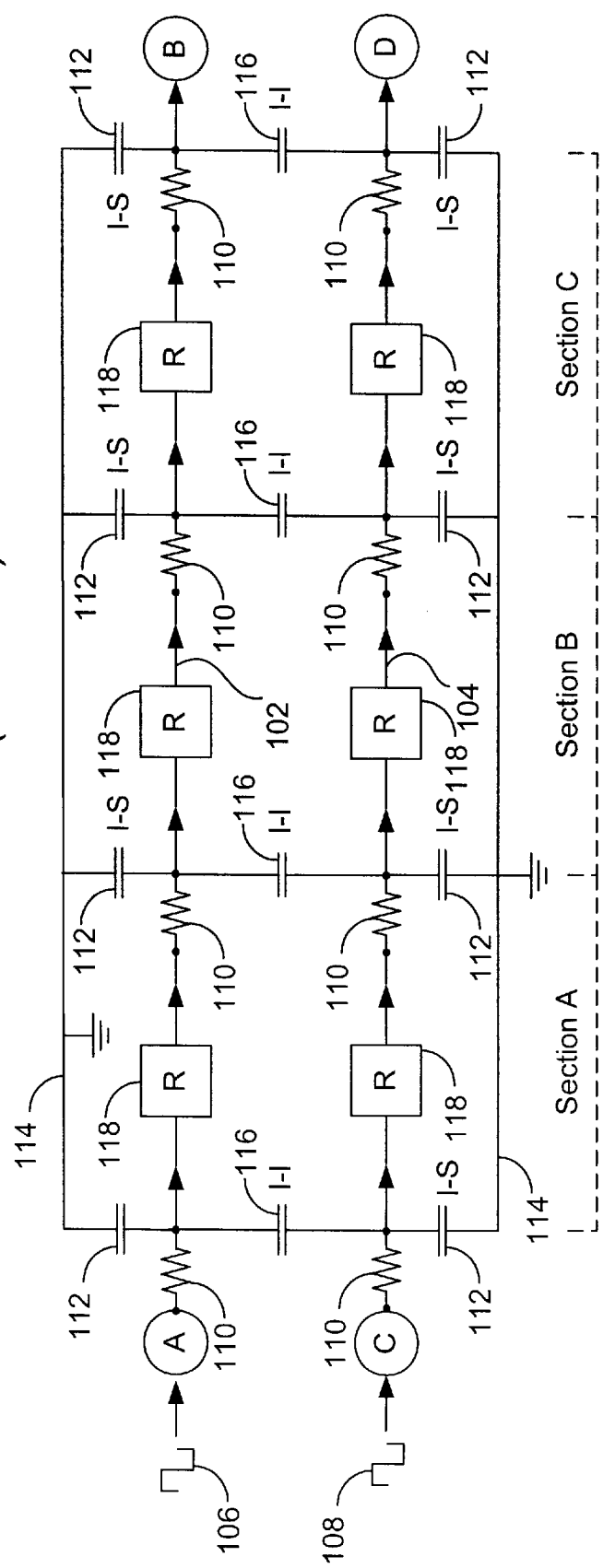
FIG. 1 is a schematic diagram of two prior art interconnects between functional blocks and relevant capacitance and resistance parameters affecting the interconnects.

The following description includes the best presently contemplated mode for carrying out the present invention. This description is not to be taken in a limiting sense, but is made merely for the purpose of describing the general principles of the interweaved integrated circuit interconnect systems and methods. Further, the interweaved integrated circuit interconnect systems and methods are not to be limited to the particular implementation described or to any particular implementation in software, firmware, hardware, or any combination thereof. Instead, the present invention can be easily implemented in any number of ways, but may be implemented as software stored on a computer readable medium such as an electronic, magnetic, optical, or other physical device. The scope of the interweaved integrated circuit interconnect systems and methods invention should be determined by referencing the appended claims.

Integrated circuits are electrical circuits comprising transistors, resistors, capacitors, and/or other functional blocks on a semiconductor "chip" in which the functional blocks are interconnected to perform a given task, for example, but not limited to, a microprocessor, programmable logic device (PLD), electrically erasable programmable memory (EEPROM), random access memory (RAM), operational amplifier, or voltage regulator, or a large number of other tasks known to those skilled in the art. Very large scale integration (VLSI) technology is often utilized to create semiconductor integrated circuits comprising thousands of logic element functional blocks and interconnects. Very large scale integration circuits are fabricated on substrates such as silicon, on sapphire, gallium arsenide or germanium wafer and the very large scale integration circuits typically include interconnects and logic element functional blocks.

The logic element functional blocks control the signal processing and include elements, for example, but not limited to, logic gates, latches, memory arrays or multipliers. These logic element functional blocks are often built up on an integrated circuit into multiple layers. In order for each of these logical element functional blocks to perform they need inputs and outputs. These inputs and outputs are usually interconnects from other logical element functional blocks. These data interconnects typically run horizontally on a layer or vertically through a layer. The interconnects that run horizontally in a layer also are typically run orthogonally on one side of the layer as compared to the opposite side of the layer. For example, this means that in adjacent pair of layers the upper layer the interconnects run in one direction as in north-south, and then on the lower layer the interconnects would be perpendicular and would run east-west. The interconnects carry control signals, data signals, and clock signals.

In general, with regard to generating the design of the integrated circuits, net lists are generated by various means including extraction from schematics and "artwork" (detailed layouts of functional blocks and interconnects and nodes). The net list is a listing of all the logical element functional blocks and the connectivity of the logical element functional blocks that comprise a block of logic. The net list is fed into a placement and routing tool, which generates the layout of the integrated circuits therefrom. The resulting layout designates the actual position and placement of interconnects of the integrated circuits. The degree to which the placement of each functional block is optimized is a function of the design criteria of the placement and routing algorithm implemented by the placement and routing tool and the amount of central processing unit (CPU) time devoted to the operation of the placement and routing tool.

These algorithms are designed to minimize the routing resistance and capacitance in the integrated circuits by generally minimizing the routing lengths between connections. In general, if the routing lengths are minimized, then the interconnect capacitive load is minimized, and the integrated circuit is faster, smaller (i.e., denser), and consumes less power, all of which are desirable attributes. However, interweaving the interconnects may reduce interconnect-to-interconnect capacitance even at the cost of longer interconnects. Most conventional placement and routing algorithms achieve this optimization via an iterative, pseudo-random placement scheme. After an initial placement of the functional blocks, each functional block is considered for a move to see if the design can be optimized by the move. Also, within a functional block, after an initial placement of nodes, the nodes may be considered for a move to see if the design can be optimized. The type of moves considered include: (1) swapping the position of a functional block with another functional block, (2) moving the position of a functional block to a new location; and (3) swapping the position of a node with another node. Such moves also cause the placement of interconnects to change. The determination of whether or not the design, and therefore the accomplishment of the task by the integrated circuit, can be improved by the move is based upon a cost function. The proposed move will be accepted as long as the proposed move does not significantly adversely affect the accomplishment of the task of the integrated circuit. For example, the cost function may be the total interconnect length of the design, whereby the lower the total interconnect length, the more optimized the design. The cost function for interweaved integrated circuits may take into consideration the interconnect-to-interconnect capacitance due to Miller capacitance.

A calculation is done by the algorithm for each move to determine the change in the cost function caused by the proposed move. If the change is negative, thereby generating a new lower cost function, then the move is accepted and used as a new placement for the functional block under consideration for further iterations of the algorithm. Selecting only negative cost function changes is called a "greedy" algorithm.

A more advanced placement and routing algorithm, referred to as "simulated annealing", will occasionally accept moves producing a positive change in the cost function. In such cases, the simulated annealing algorithm will either accept or refuse the proposed move based upon the magnitude of a positive change, a decreasing value called the "temperature", and a random number so that the selection of the move is a probabilistic selection. Thus, a simulated annealing placement and routing algorithm performs design optimization via multiple iterations of a pseudo-random placement scheme modified by a temperature cost function. A detailed explanation of simulated annealing algorithms can be found, for instance, in Carl Sechen, "VLSI Placement and Global Routing Using Simulated Annealing," Chapter 2, Kluwer Academic Publishers, Boston, 1st Edition (1988), the disclosure of which is incorporated herein by reference.

Figure 2:
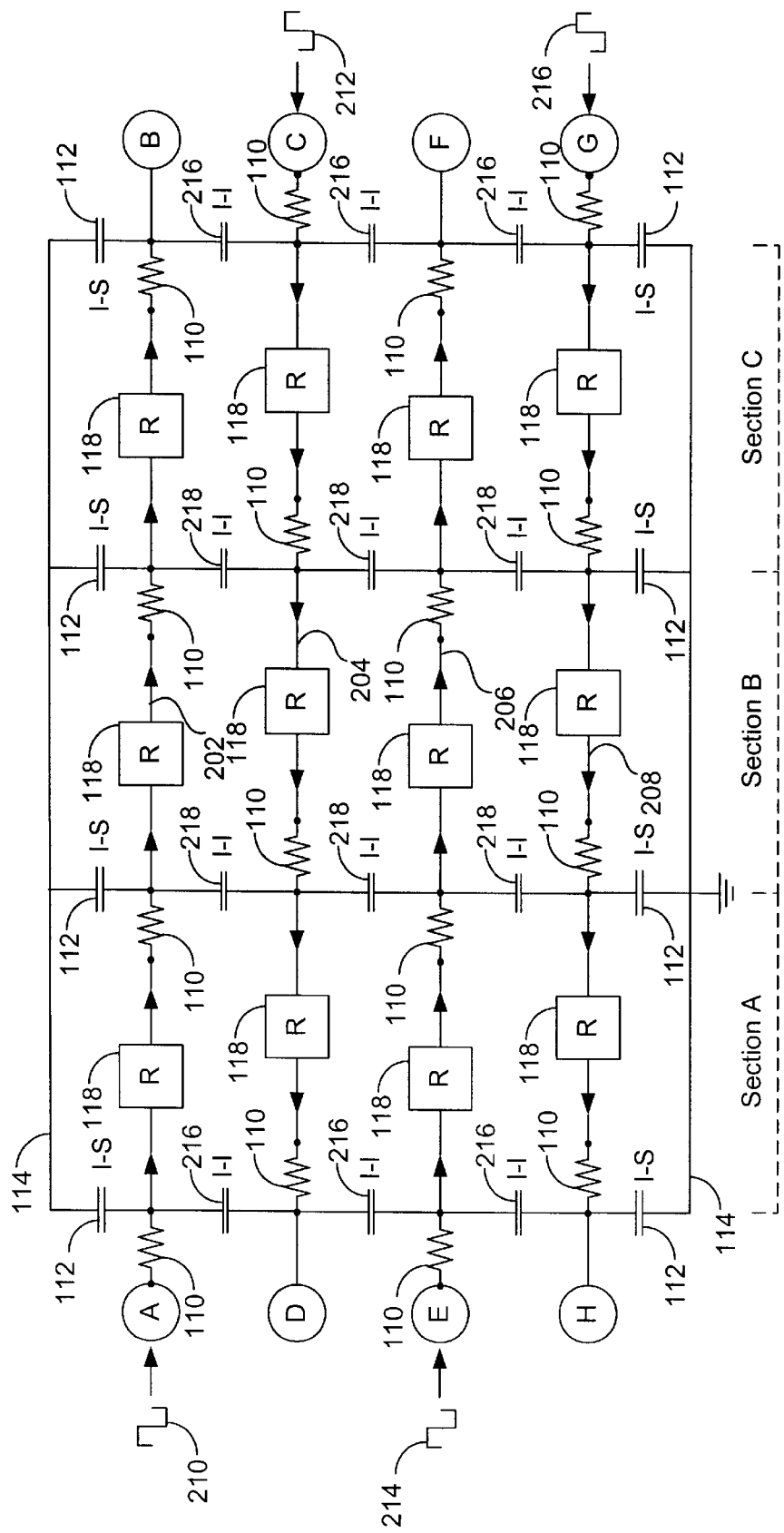
FIG. 2 is a schematic diagram of four interweaved integrated circuit interconnects between functional blocks and relevant capacitance and resistance parameters affecting the interweaved integrated circuit interconnects.

Prior to discussing the fabrication software further, FIG. 1 shows prior art interconnects and FIG. 2 shows interweaved integrated circuit interconnects. FIG. 1 is a schematic diagram of two prior art interconnects between functional blocks and relevant capacitance and resistance parameters affecting the interconnects. FIG. 1 shows a first interconnect 102 between node A and node B and a second interconnect 104 between nodes C and D. Nodes A and C may be two nodes from the same functional block. And nodes B and D may be from a second functional block. Nodes A, B, C, and D may also all be from separate functional blocks. FIG. 1 shows first interconnect 102 and second interconnect 104 running adjacent. "Adjacent" indicating the interconnects are parallel to each other and there are no other interconnects between the adjacent interconnects. It is not required that the adjacent interconnects are adjacent throughout their length. Interconnects may be adjacent for only a portion of their length.

In FIG. 1, a first signal 106 is passed from node A to node B and a second signal 108 is passed from node C to node D.

The resistance of first interconnect 102 and second interconnect 104 is modeled by resistors 110. The interconnect-to-substrate capacitance for first interconnect 102 and second interconnect 104 is modeled by I-S capacitors 112. For interconnect-to-substrate capacitance, the integrated circuit substrate acts as a ground. The substrate ground is modeled in FIG. 1 by substrate-ground lines 114. The interconnect-to-interconnect capacitance is modeled by I-I capacitors 116. Also shown in FIG. 1 are repeaters 118 spaced along first interconnect 102 and second interconnect 104.

The first interconnect 102 and second interconnect 104 can be any conductive material. First interconnect 102 and second interconnect 104 are often deposited aluminum but may be any of a large number of conductive materials known in the art. First signal 106 and second signal 108 can be any signal of a large number of signals known to those in the art. First signal 106 and second signal 108 are often varying voltages representing data bits.

Resistors 110 represent the inherent resistance of first interconnect 102 and second interconnect 104. The inherent resistance depends primarily upon the conductive material and the geometry of the interconnect. The interconnect-to-substrate capacitance is modeled by I-S capacitors 112. The value of I-S capacitors 112 depends primarily upon the surface area of the interconnect and the distance of the interconnect from the substrate. Resistors 110 of FIG. 1, I-S capacitors 112 of FIG. 1, and I-I capacitors 116 of FIG. 1, represent electrical properties of the integrated circuit and do not represent functional blocks of the integrated circuit. However, the functional blocks connected to first interconnect 102 and second interconnect 104 may include resistors and capacitors.

FIG. 1 shows adjacent first interconnect 102 and second interconnect 104 divided into three sections designated A, B, and C. Sections A, B, and C each include one repeater. When first signal 106 and second signal 108 travel in the same direction along adjacent first interconnect 102 and second interconnect 104, the signals are likely to induce Miller capacitance in sections A, B, and C. The Miller capacitance is a component of the interconnect-to-interconnect capacitance modeled as I-I capacitors 116. Typically, integrated circuits are designed to allow for the worst case scenario of Miller capacitance affecting the first 102 and second interconnect 104 throughout sections A, B, and C.

FIG. 2 is a schematic diagram of four interweaved integrated circuit interconnects between functional blocks and relevant capacitance and resistance parameters affecting the interweaved integrated circuit interconnects. FIG. 2 shows a first interconnect 202 between node A and node B, a second interconnect 204 between node D and node C, a third interconnect 206 between node E and node F, and a fourth interconnect 208 between node H and node G. Nodes A, D, E, and F may be nodes from the same functional block or different functional blocks. Similarly, nodes B, C, F and G may be from a second functional block or may be from separate functional blocks. FIG. 2 shows first interconnect 202, second interconnect 204, third interconnect 206, and fourth interconnect 208 running adjacent.

In FIG. 2, a first signal 210 is passed from node A to node B, a second signal 212 is passed from node C to node D, a third signal 214 is passed from node E to node F, and fourth signal 216 is passed from node G to node H. The resistance of interconnects 202, 204, 206, and 208 are modeled by resistors 110. The interconnect-to-substrate capacitance for first interconnect 202 and fourth interconnect 208 are modeled by I-S capacitors 112. Interconnect-to-substrate capacitance also affects second interconnect 204 and third interconnect 206 but the interconnect-to-substrate capacitance is not shown in FIG. 2 for the second interconnect 204 and third interconnect 206. Substrate-ground lines 114 are shown for the first interconnect 202 and the fourth interconnect 208 and are understood to also be applicable to the second interconnect 204 and the third interconnect 206. Also shown in FIG. 2 are repeaters 118 spaced along interconnects 202, 204, 206, and 208.

FIG. 2 shows adjacent interconnects 202, 204, 206, and 208 divided into three sections designated A, B, and C. Sections A, B, and C each include one repeater per interconnect. The interconnect-to-interconnect capacitance in sections modeled by periphery I-I capacitors 216 and central I-I capacitors 218. When first signal 210 and second signal 212 transition at the same time and travel in opposite directions along adjacent first interconnect 202 and second interconnect 204, the signals are likely to pass and therefore induce Miller capacitance in only section B. The Miller capacitance is included a component of the interconnect-to-interconnect capacitance modeled as central I-I capacitors 218. Periphery I-I capacitors 216 are less likely to be affected by Miller capacitance. Interweaving the interconnects allows for designing integrated circuits to allow for the Miller capacitance affecting only a portion of the interconnects. Because the first signal 210 and second signal 212 are affecting each other for less time than if they were traveling along side each other in the same direction, the total Miller capacitance between first interconnect 202 and second interconnect 204 is reduced. A similar reduction in Miller capacitance, takes place between the second interconnect 204 and the third interconnect 206. And, similarly, between third interconnect 206 and fourth interconnect 208.

The interweaved integrated circuit interconnect provides an improved integrated circuit. Accordingly, the following discussion of the interweaved integrated circuit interconnect provides an improved system and method for generating an improved design for placement of functional blocks and interconnects.

Figure 3:
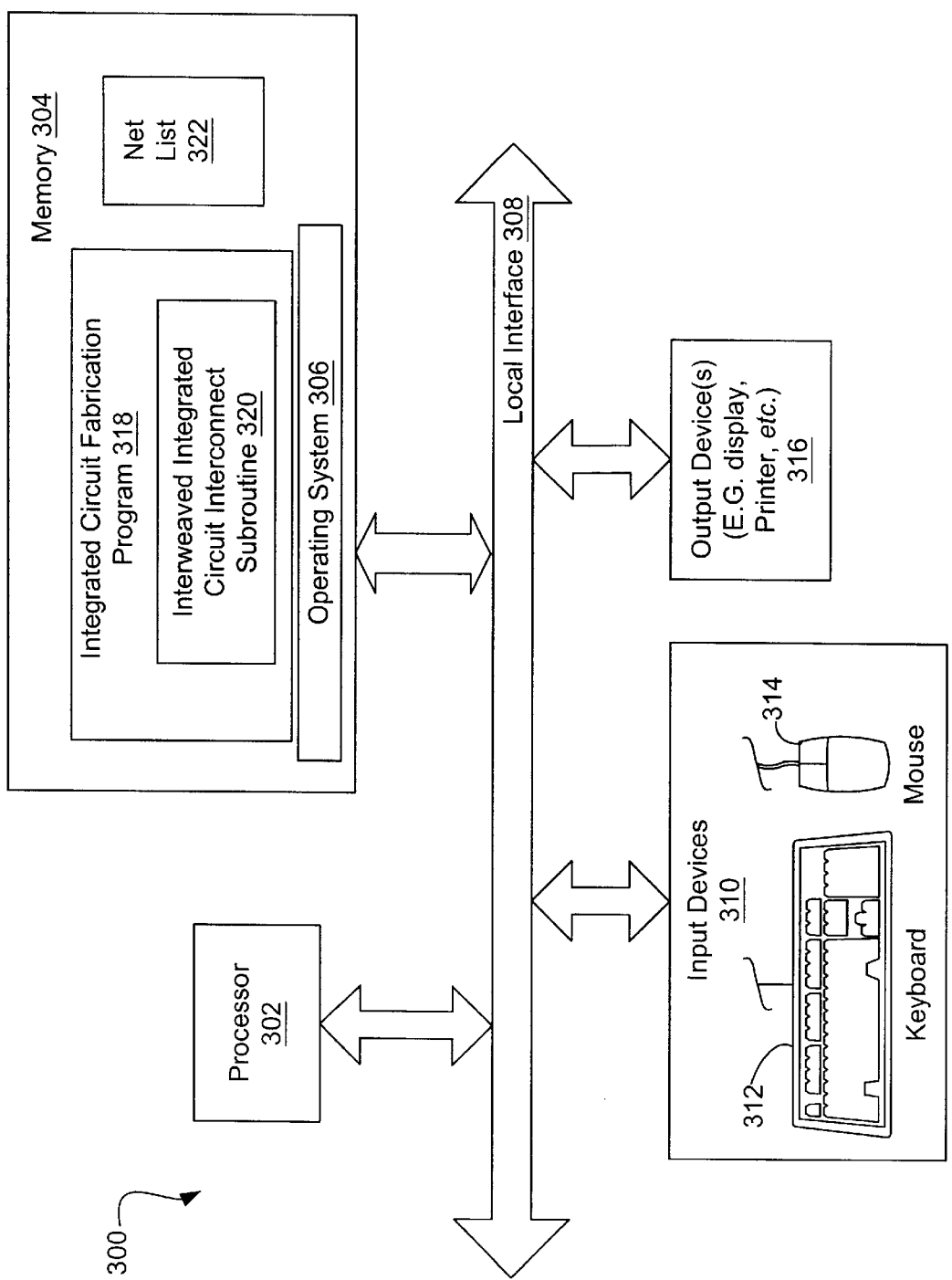
FIG. 3 is a block diagram illustrating a possible implementation in a computer system of the interweaved integrated circuit interconnect subroutine for fabricating an integrated circuit designed to rearrange interconnects so that signals travel in opposite directions on parallel interconnects such as the four interweaved integrated circuit interconnects of FIG. 2.

FIG. 3 is a block diagram of a computer system containing an interweaved integrated circuit interconnect subroutine 320 for fabricating an integrated circuit designed to rearrange interconnects so that signals travel in opposite directions on parallel interconnects such as the four interweaved integrated circuit interconnects of FIG. 2. FIG. 3 shows a computer system 300 generally comprising a processor 302, storage units (not shown) such as a hard disk drive and a floppy disk drive, and a memory 304 with an operating system 306.

The processor 302 is typically a commercially available processor, such as the PENTIUM microprocessor from INTEL Corporation, POWERPC microprocessor, SPARC processor, PA-RISC processor or 68000 series microprocessor. Many other processors are also available. Such a processor usually executes a program referred to as the operating system 306, such as the various versions of the WINDOWS operating systems from MICROSOFT Corporation, the NETWARE operating system available from NOVELL, Inc., or the UNIX operating system available from many vendors such as SUN MICROSYSTEMS, Inc., HEWLETT-PACKARD and AT&T. The operating system 306 controls the execution of other computer programs such as the integrated circuit fabrication program 318 and provides scheduling, input-output control, file and data management, memory management, and communication control and related services. The processor 302 and operating system 306 define a computer platform, for which application programs in high level programming languages are written. The processor 302 accepts data from memory 304 over a local interface 308, such as a bus(es).

The user can direct the computer system 300 by using input device(s) 310. Input device(s) 310 may be, for example, but not limited to, a mouse 312 and a keyboard 314. The action input, and result output, may be displayed on an output device(s) 316, for example, but not limited to, a display terminal, and a printer. The input device(s) and output device(s) communicate with the processor 302 and memory 304 via the local interface 308.

The memory 304 can be either one, or a combination, of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, dynamic random access memory (DRAM), static random access memory (SRAM), or the like. The memory 304 may also include either one, or a combination, of nonvolatile memory, such as disk drives, tape drives, CDROM drives, cartridges, cassettes, or memory located on a network server. Software residing in the memory 304 configures and is executed by the processor 302 and, generally, the computer 300. The software includes an operating system 306 and an integrated circuit fabrication program 318 that operates in connection with the operating system 306.

Stored in the memory 304 is an integrated circuit fabrication program 318. Also in the memory is the interweaved integrated circuit interconnect subroutine 320. The integrated circuit fabrication program 318 and the interweaved integrated circuit interconnect subroutine 320 operate in conjunction with the net list 322. The net list 322 includes a listing of all the functional blocks and the interconnects of the functional blocks. The interweaved integrated circuit interconnect subroutine 320 can be implemented in hardware, software, firmware, or a combination thereof. The interweaved integrated circuit interconnect subroutine 320 may be associated with any of a number of integrated circuit fabrication programs known to those skilled in the art, such as those based on SPICE, and on those including schematic and artwork editors, floorplanners, block placers, and routers.

The interweaved integrated circuit interconnect subroutine 320, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 4 is a flowchart of the interweaved integrated circuit interconnect subroutine 320 for fabricating an integrated circuit designed to rearrange interconnects so that signals travel in opposite directions on parallel adjacent interconnects. The flowchart of FIG. 4 shows the architecture, functionality, and operation of a possible implementation of the interweaved integrated circuit interconnect subroutine 320. In this regard, each block represents a module, segment, or portion of code, which comprises one or more executable instructions for implementing the specified logical function(s). Those skilled in the art are able to adapt the flowchart of FIG. 4 to a subroutine for any integrated circuit design program.

Such integrated circuit design programs are described in: U.S. Pat. No. 6,185,726, issued to Chou; "Modeling of High Speed Metal-Insulator-Semiconductor Interconnections: The Effect of ILD on Slow-Wave Attenuation," A thesis by Liyong Wang submitted to the Graduate Faculty of Renselaer Polytechnic Institute, available at http://inp.cie.rpi.edu/research/mcdonald/frisc/theses/LWangThesis/LWangThesis.html; "Investigation of Interconnect Capacitance using Charge-Based Capacitance Measurement (CBCM) Technique and 3-D Simulation," by Sylvester et al., IEEE Journal of Solid-State Circuits, March 1998, pp. 500–503; "High Frequency VLSI Interconnect Modeling," by Sylvester, available at http://www-device.eecs.berkeley.edu/~dennis/ee241/final.html; and "Design of VLSI Systems," available at http://vlsi.wpi.edu/webcourse/toc.html; which are entirely incorporated herein by reference.

In FIG. 4, the integrated circuit fabrication program 318 enters the interweaved integrated circuit interconnect subroutine 320 at step 402. In step 404, the subroutine identifies interconnects that connect nodes associated with functional blocks. In step 406, the integrated circuit interconnect subroutine 320 determines the direction of signal travel on each of the interconnects identified in step 404. In step 408, the integrated circuit interconnect subroutine 320 places each of the identified interconnects on the integrated circuit so that the direction of signal travel alternates on adjacent interconnects. Step 408, also includes the step of evaluating whether changes to the integrated circuit to accomplish the interweaving of the identified interconnects is worth the price of the redesign.

This may be accomplished by as simple a procedure as determining the interconnects run between the same two function blocks and the placement does not affect the operation of the functional blocks. Therefore, some adjacent interconnects will able to be interweaved in step 408 without any price. For example, if multiple interconnects are running between two functional blocks, in the prior art the multiple interconnects would often have been placed on the integrated circuit with all of the interconnects carrying signals in the same direction laying next to each other. For this example, the multiple interconnects may be interweaved without any price if the functional blocks are able to accommodate the node changes required to transmit the signals on the interweaved interconnects. The evaluation may also be accomplished using a cost function.

On the other extreme, adjacent interconnects may be running one way, serially along separate function blocks that cannot easily be relocated. Rearrangement of the integrated circuit architecture may not be advisable to gain the advantage of a reduction in Miller capacitance on adjacent interconnects. Those skilled in the art recognize the vast quantities of possible combinations of functional blocks and resulting interconnections that can be used to design an integrated circuit to accomplish any particular task. Those skilled in the art are aware of the tradeoffs to meet the goals of integrated circuit design while accomplishing the task. Those skilled in the art are able to calculate whether the benefits of reduced Miller capacitance are worth the cost of relocating and/or modifying the integrated circuit architecture. Those skilled in the art will be able to apply such a calculation in step 408. In step 410, the interweaved integrated circuit interconnect subroutine 320 is exited and the integrated circuit design software returns to the main program.

It should be emphasized that the above-described embodiments of the present invention, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A computer readable medium having software for assisting in designing an integrated circuit, the integrated circuit having a plurality of functional blocks, the integrated circuit designed to accomplish a task, the medium comprising:
    (a) logic for identifying a plurality of interconnects, the plurality of interconnects connecting to a portion of the functional blocks;
    (b) logic for determining the direction of signal travel on each of the plurality of interconnects; and
    (c) logic for placing the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent that interconnect-to-interconnect capacitance is reduced without significantly adversely affecting the task, wherein the first signal is representative of first data and the second signal is representative of second data, the first data being different from the second data.

2. The computer readable medium of claim 1, wherein the logic for identifying, logic for determining, and logic for placing are incorporated into an integrated circuit fabrication program.

3. The computer readable medium of claim 1, wherein the plurality of interconnects run between state machines.

4. The computer readable medium of claim 1, wherein the logic for placing the plurality of interconnects so that the direction of signal travel alternates on adjacent interconnects to the extent interconnect-to-interconnect capacitance is reduced without significantly adversely affecting the task includes logic for evaluating a cost function.

5. A computer readable medium having software for assisting in designing an integrated circuit, the integrated circuit having at least two functional blocks, the medium comprising:
    (a) logic for identifying a plurality of interconnects between the two functional blocks;
    (b) logic for determining the direction of signal travel on the plurality of interconnects; and
    (c) logic for placing the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent that interconnect-to-interconnect capacitance is reduced, wherein the first signal is representative of first data and the second signal is representative of second data, the first data being different from the second data.

6. The computer readable medium of claim 5, wherein the logic for identifying, logic for determining, and logic for placing are incorporated into an integrated circuit fabrication program.

7. The computer readable medium of claim 5, wherein the two functional blocks are two state machines.

8. The computer readable medium of claim 5, wherein the logic for placing the plurality of interconnects so that the direction of signal travel alternates on adjacent interconnects to the extent interconnect-to-interconnect capacitance is reduced includes logic for evaluating a cost function.

9. A method for fabricating an integrated circuit, the integrated circuit having a plurality of functional blocks, the integrated circuit designed to accomplish a task, the method comprising the steps of:
    (a) identifying a plurality of interconnects, the plurality of interconnects connecting a portion of the functional blocks;
    (b) determining the direction of signal travel on the plurality of interconnects; and
    (c) placing the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent interconnect-to-interconnect capacitance is reduced without significantly adversely affecting the task, wherein the first signal is representative of first data and the second signal is representative of second data, the first data being different from the second data.

10. The method of claim 9, wherein the steps for identifying, determining, and placing are incorporated into an integrated circuit fabrication program.

11. The method of claim 9, wherein the functional blocks are state machines.

12. The method of claim 9, wherein the step of placing the plurality of interconnects includes the step of evaluating a cost function.

13. A method for fabricating an integrated circuit, the integrated circuit having at least two functional blocks, the method comprising the steps of:
    (a) identifying a plurality of interconnects between the two functional blocks;
    (b) determining the direction of signal travel on the plurality of interconnects; and
    (c) placing the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent interconnect-to-interconnect capacitance is reduced, wherein the first signal is representative of first data and the second signal is representative of second data, the first data being different from the second data.

14. The method of claim 13, wherein the steps for identifying, determining, and placing are incorporated into an integrated circuit fabrication program.

15. The method of claim 13, wherein the functional blocks are state machines.

16. The method of claim 13, wherein the step of placing the plurality of interconnects includes the step of evaluating a cost function.

17. A system for fabricating an integrated circuit, the integrated circuit having a plurality of functional blocks, the integrated circuit designed to accomplish a task, the system comprising:

(a) means for identifying a plurality of interconnects the plurality of interconnects connecting a portion of the functional blocks;

(b) means for determining the direction of signal travel on the plurality of interconnects; and (c) means for selecting the placement of the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent interconnect-to-interconnect capacitance is reduced without significantly adversely affecting the task, wherein the first signal is representative of first data and the second signal is representative of second data, the first data being different from the second data.

18. The system of claim 17, wherein the means for identifying, means for determining, and means for selecting are incorporated into an integrated circuit fabrication program.

19. The system of claim 17, wherein the portion of the functional blocks are state machines.

20. The system of claim 17, wherein the means for selecting includes a means for evaluating a cost function.

21. A system for fabricating an integrated circuit, the integrated circuit having at least two functional blocks, the system comprising:

(a) means for identifying a plurality of interconnects between the two functional blocks;

(b) means for determining the direction of signal travel on the plurality of interconnects; and (c) means for selecting the placement of the plurality of interconnects so that the direction of signal travel alternates on adjacent interconnects, such that a first signal propagating along a first of the adjacent interconnects exhibits a time-varying phase relationship with respect to a second signal propagating along a second of the adjacent interconnects, to the extent interconnect-to-interconnect capacitance is reduced, wherein the first signal is representative of first data and the second signal is representative of second data, the first data being different from the second data.

22. The system of claim 21, wherein the means for identifying, means for determining, and means for selecting are incorporated into an integrated circuit fabrication program.

23. The system of claim 21, wherein the functional blocks are state machines.

24. The system of claim 21, wherein the means for selecting includes a means for evaluating a cost function.

* * * * *